United States Patent [19]

Ohta

[11] 4,366,494

[45] Dec. 28, 1982

[54] JOSEPHSON JUNCTION AND A METHOD OF MAKING THE SAME

[75] Inventor: Hiroshi Ohta, Wako, Japan

[73] Assignees: Rikagaku Kenkyusho; Science and Technology Agency, both of Tokyo, Japan

[21] Appl. No.: 151,693

[22] Filed: May 20, 1980

[51] Int. Cl.³ .......................................... H01L 39/22
[52] U.S. Cl. ....................................... 357/5; 357/4; 307/306; 307/462; 324/248
[58] Field of Search .............. 357/5, 4; 307/306, 462; 324/248

[56] References Cited

U.S. PATENT DOCUMENTS

| | | | |
|---|---|---|---|
| 4,055,847 | 10/1977 | Fletcher | 307/306 |
| 4,177,476 | 12/1979 | Kroger et al. | 357/5 |
| 4,220,959 | 9/1980 | Kroger et al. | 357/5 |
| 4,224,630 | 9/1980 | Kroger | 357/5 |
| 4,263,603 | 3/1981 | Jillie, Jr. | 307/306 |

OTHER PUBLICATIONS

Cloasen, *Appl. Phys. Lett.*, 36(9), May 1, 1980, pp. 771–773.

*Primary Examiner*—Martin H. Edlow
*Attorney, Agent, or Firm*—Kerkam, Stowell, Kondracki & Clarke

[57] ABSTRACT

Disclosed is an improved Josephson junction comprising a superconductor-separator-superconductor laminar depositions on a substrate, the overlying and underlying superconductor layers being laid offset to each other, and a weak link extending from one of the superconductor layers to the other across the thickness of the intervenient separator. A triple layer superconducting device according to this invention has as short barrier length and as low capacitance as possible, and is characteristic of a large product of junction resistance and critical current. Also, the geometrical configuration of the device is most appropriate for the purpose of massproduction.

26 Claims, 14 Drawing Figures

FIG. 8
(a)
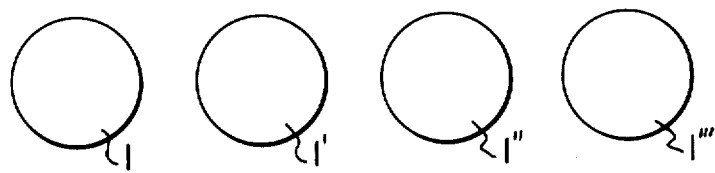
(b)
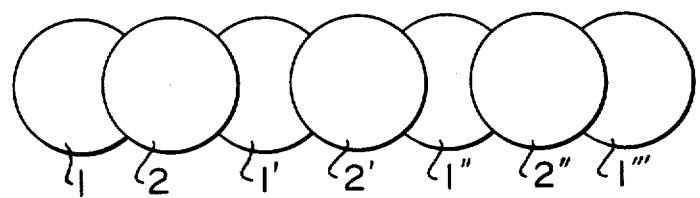
(c)
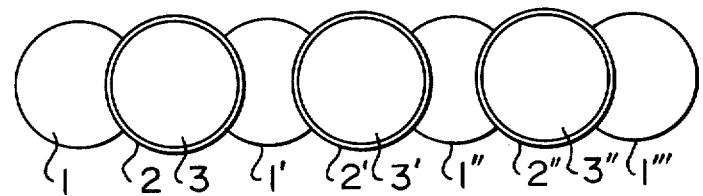
(d)
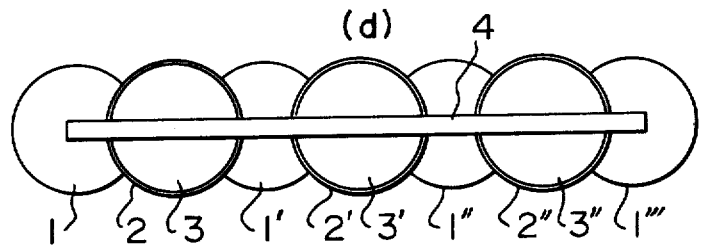

JOSEPHSON JUNCTION AND A METHOD OF MAKING THE SAME

This invention relates to a superconducing device using Josephson effect and a method of producing the same.

Applications of Josephson junctions include high-sensitive and wide-band detection of microwave and millimeter-wave radiation, and high-speed and low-power switching of logic circuits in an electronic computer. There has been an ever increasing demand for practical and industrial use of Josephson superconducting devices because they are superior to semiconductor ones almost in every respect.

A variety of Josephson junctions have been hitherto known, as for instance, a point-contact junction (FIG. 1), a thin-film tunnel junction (FIG. 2), a coplanar junction (FIG. 3), a superconducting microbridge (FIG. 4), and a variable thickness microbridge (FIG. 5).

The point-contact junction has a very good performance, but it is too much susceptible to mechanical shock, and still disadvantageously it is not appropriate for the purpose of massproduction.

The thin-film tunnel junction has a very good performance, but the characteristics of the device is liable to change when subjected repeatedly to the temperature cycle between the room temperature and the cryogenic temperature, at which the device operates. Still disadvantageously the life of the device will be shortened unless it is kept below the temperature of liquid nitrogen. Also, the junction area of the device must be reduced to a possible minimum. Because otherwise the capacitance of the device would be at such a large value that the device is unappropriate for the application of high-speed switching.

The coplanar junction and the microbridge (FIGS. 3 and 4) are strong and tough enough to resist both the mechanical shock and the temperature change and these devices are appropriate for the purpose of massproduction. The product of the critical current and the junction resistance of these devices, however, remain at a relatively low value, and accordingly the performance of the devices is poor.

The variable thickness microbridge of FIG. 5, in which the thickness "T" of the electrodes is much larger than the thickness "t" of the weak link, has a large product of the critical current and the junction resistance, and accordingly it has a fairly good performance. The device is strong enough to resist the mechanical shock and the temperature change. The variable thickness microbridge, however, is very difficult to produce in large quantities. Because niobium, vanadium and other materials of which the device is made is too hard to handle. As is readily seen from the geometrical structure of FIG. 5, it is very difficult to grave such a hard material into a three-dimensional and submicron shape. The performance of the device can be improved by reducing the size of the weak link, particularly the length "L" thereof. For the satisfactory performance the length "L" and the width "W" must be less than one micrometer, which is very close to the revolution attainable in the photo-lithography. In this connection it is almost impossible to fabricate variable thickness microbridges in an industrial scale.

In an attempt to provide a Josephson junction which can be produced in large quantities, still having a fairly good performance when working, the inventor proposed a new geometrical structure as shown in FIG. 6, and the inventor filed a patent application therefor on the 19th of November in 1977 in Japan which was laid open to the public on July 16, 1979.

As seen from FIG. 6, a Josephson junction thus proposed comprises a triple-layer body built up from alternate superconductor layers 1 and 3 and separator layer 2. As shown, the superconductor layers 1 and 3 are at the top and the bottom of the triple-layer body and a weak link 4 extends across on a part of the side of the triple-layer body. An extensive pad 5 of superconducting thin film lies under the bottom superconductor layer 1 and a substrate 6 extends under the pad film 5. This geometrical configuration has numerous advantages as follows: It is resistant to mechanical shock, and its operating characteristics will not change after it has been repeatedly subjected to temperature cycles. The geometrical structure enables controlling the barrier length "1" of the weak link—a major factor for improving the performance of the device—in terms of the thickness of separator 2. Thus, the barrier length "1" of the weak link can be reduced to a possible minimum (well under 100 Å) without difficulty. This figure is ten times shorter than the length (0.2 micrometer) of the weak link of a microbridge, which is produced by the most advanced electron beam lithography and dry etching. Thanks to the drastic reduction of the barrier length "1" of the weak link, semimetals, doped semiconductors and other materials which have been hitherto deemed improper for the purpose of making a weak link can be used. Because pieces of such materials will not permit the flow of supercurrent unless their barrier length is reduced to one hundred angstroms, much shorter than the minimum barrier length which has been hitherto attained. Thus, the geometrical configuration of FIG. 6 has extended the scope of choice to semimetals and doped semiconductors beyond super conductors and normal metals which have been usually used. The junction of FIG. 6, however, has too large a capacitance to use as a high frequency radiation detector or a high-speed switching element.

In modern superconductivity technology, the term "weak link" means the conducting junction between bulk superconducting specimens (electrodes), the critical current through which is much less than that in the electrodes. Throughout the specification the term "weak link" is used in accordance with the foregoing definition to identify the conductive junction established between superconducting electrodes which exhibit direct (non-tunnel-type) conductivity.

In an attempt to provide a Josephson junction having a decreased capacitance and holding the advantages attributable to the geometrical configuration of FIG. 6 the inventor proposed a new geometrical configuration, which is hereinbelow called "quasi-planar" after its almost flat shape.

Thus, one object of this invention is to provide an improved geometrical configuration of Josephson junction having a minimum capacitance and holding the advantages attributable to the geometrical shape of FIG. 6.

Another object of this invention is to provide a method of making the same.

To attain these objects a "quasi-planar" Josephson junction according to this invention comprises two superconductor layers offset from and partially facing to each other, a spacer between these opposite superconductor layers and a weak link extending from one of the superconductor layers to the other across the thickness of the intermediate spacer.

BRIEF DESCRIPTION OF THE DRAWINGS

A "quasi-planar" Josephson junction according to this invention will be better understood from the following description of preferred embodiments which are shown in FIGS. 1-14.

FIG. 8 shows a manner in which such superconducting devices are produced in the form of series-connection according to this invention;

Referring to FIG. 7 there is shown a "quasi-planar" Josephson junction according to the first embodiment of this invention. As shown in the drawing, the top and bottom superconductor layers 1 and 3 are laid offset to each other so that the overlapping area of the superconductor layers 1 and 3 with an insulator spacer 2 sandwiched therebetween is substantially reduced, i.e. the area of the portion of the superimposing layers which overlap is substantially less than the total surface area of the corresponding superconductor layer. Thus, the capacitance of the superconducting device is reduced to a small value, compared with the capacitance of the Josephson junction as shown in FIG. 6.

Figure 1:
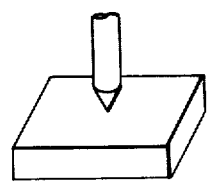
FIG. 1 illustrates a point-contact Josephson junction.
Figure 2:
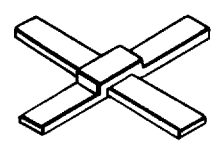
FIG. 2 illustrates a thin-film tunnel Josephson junction.
Figure 3:
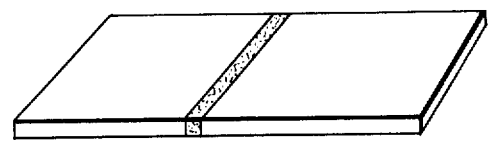
FIG. 3 Illustrates a co-planar Josephson junction.
Figure 4:
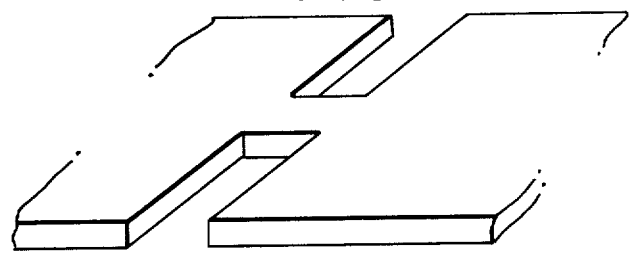
FIG. 4 illustrates a superconducting microbridge Josephson junction.

Accordingly the switching speed of the device when applied to an electronic computer, rises and the speed at which the device responds to the microwave radiation, rises, too. This will enlarge the scope of application of superconducting devices beyond that which has been deemed practically possible.

Also it should be noted that the geometrical shape of the superconducting device according to this invention makes it easy to fabricate series-connected junctions. Referring to FIG. 8, there are shown a sequential steps for fabricating superconducting devices according to this invention.

An apertured mask of photoresist or electron beam resist (not shown) is laid on a substrate, and then a superconductor material is sputtered onto the substrate through the apertured mask so that the sputtered material is deposited on the substrate in the form of a series of separate circles 1, 1', 1" and 1''', in FIG. 8(a). Then, another apertured resist mask is laid in such a position that each aperture of the mask selects and exposes the convexo-convex parts of adjacent superconductor circles, and an insulator material is sputtered through the apertured mask so that another series of insulator circles 2, 2' and 2" are put on the substrate, partly overlapping the underlying series of superconductor circles (FIG. 8(b)). The superconductor material is again sputtered through the apertured mask to deposit on each insulator circle as indicated at 3, 3' and 3" in FIG. 8(c). After the surface of the multilayer body is sputter-etched to be atomically clean (described below in some details), a barrier material is sputtered to deposit on the whole area without breaking the vacuum in which the preceeding process has been carried out. An elongated strip of resist is longitudinally laid across the series connection of laminar deposition. Barrier material is etched off from the unmasked part, leaving the barrier material underneath the resist strip. Thus, a series-connected multiple junction results (FIG. 8(d)). The superconducting device, as shown in FIG. 8(d) comprises a laminar body including at least one set of semiconductor layers. Each set includes a pair of first superconductor layers and a second superconductor layer. At least one insulative spacer layer is disposed between the first pair of layers and the second layer. Conductive juctions extend between the second layer and each layer of the pair of superconductor layers and across the thickness of the insulative spacer layer. The second superconductor layer is offset and superposed with respect to each layer of the pair of superconductor layers such that only a portion of the second superconductor layer overlies a portion of each layer of said pair of superconductor layers.

As shown in FIG. 8(d), the superconducting device may include a plurality of such sets of semiconductor layers, with each set being spaced from the other along a longitudinal axis. The conductive junctions of each set are connected to form a series of Josephson junctions. To effect this series connection, a second insulative layer and a further second superconductor layer on the second insulative layer are provided between adjacent sets. The second insulative layer and its overlying layer are disposed between one of the pair of first superconductor layers of adjacent longitudinally spaced sets and overly a portion of each of the one of the pair of first superconductor layers. A conductive junction extends between the further second layer on the second insulative layer and each of the one of the pair of first superconductor layers. All the conductive junctions form a series connection.

Figure 9:
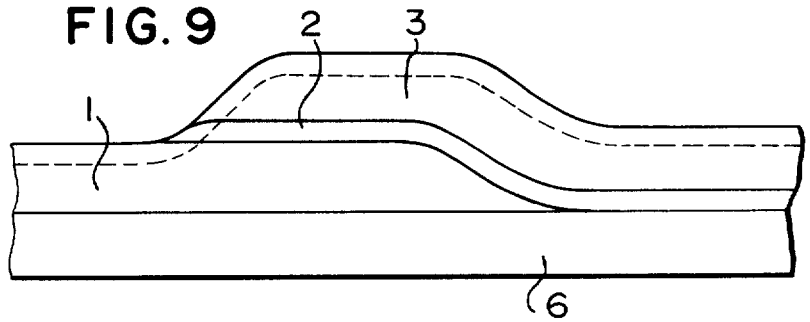
FIG. 9 shows diagrammatically a section of a triple layer body built on a substrate (semifabricated product of the superconducting device according to the first embodiment)
Figure 10:
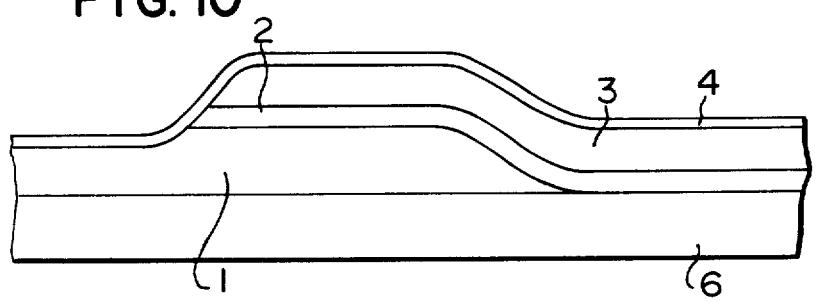
FIG. 10 is a similar view showing a triple-layer body on which a weak link is laid (finished product of the first embodiment)

Referring to FIG. 9, there is shown a section of a semifabricated device which has resulted after the second sputtering of superconductor. The superficial oxide skin (broken line) is sputter-etched and removed so that the rising slope of the laminated hill presents a clear-cut transient region from the underlying superconductor layer 1 to the overlying superconductor layer 3. Then, a barrier material which is proper for the purpose of making a weak link is sputtered and deposited across the transient region to form a weak link 4 (FIG. 10).

If use is made of a mask having a large number of apertures, a corresponding large number of Josephson junction can be simultaneously made by repeating as many sputterings as required in fabricating a single device in as long time as involved for producing a single one. Thus, the superconducting devices can be produced in large quantities without difficulty.

The superconductor layer is made of Nb, Ta, La, Pb, Sn, In, Al and other superconductor materials and the alloys thereof. Such material is sputtered and deposited several thousand angstroms thick on a substrate, or an insulator layer. The spacer is made of $SiO_2$ and other insulator materials or is made of impurity-free semiconductor materials. The insulator layer may be formed by sputtering and depositing such materials on the underlying superconductor layer 1. Alternatively the insulator layer may be produced in the form of oxide film, which will appear on the superconductor layer when subjected to the oxidizing atmosphere.

The so-formed insulator layer is several hundred angstroms thick. Any kind of superconductings material, copper and other normal metals, semiconductor materials doped with tellurium or other impurities, or bismuth and other semimetals may selectively used in forming a weak link. As described earlier with reference to FIGS. 8(c) and 8(d), a weak link may be formed by sputtering and depositing such a material several hundred angstrom thick onto the semi-fabricated product.

As seen from the geometrical feature of a "quasi-planar" Josephson junction according to this invention, the barrier length "l" varies with the thickness of the insulator layer. Therefore, the dimension of the weak link or barrier length across the insulator layer can be easily determined by adjusting the length of time for which sputtering continues, and the barrier length—one of the quality factors of the superconducting device—can be reduced as short as several hundred angstroms.

Figure 5:
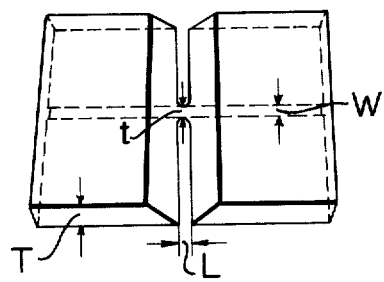
FIG. 5 illustrates a variable thicness microbridge Josephson junction.
Figure 6:
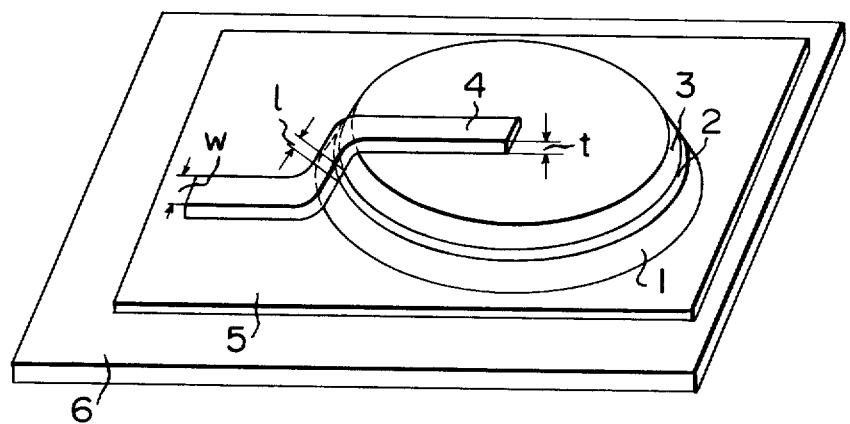
FIG. 6 illustrates a Josephson junction comprising a triple-layer body built up from alternate superconductor layers and a separator layer.

Likewise, the thickness "t" of the barrier element or weak link 4 can be easily reduced by shortening the length of time for which sputtering continues. In case where the thickness "t" of the barrier element for is selected to be small compared with the thickness "T" of the superconductor layer, the product of the critical current and the junction resistance increases to be as large as that of a variable thickness microbridge (FIG. 5), and accordingly such a "quasi-planar" Josephson junction has as fairly good performance as a variable thickness bridge.

Incidentally a series connection of Josephson junction as shown in FIG. 8d is appropriate for the purpose of impedance-matching a superconducting device to an associated wave guide when used for detecting the radiation of electromagnetic wave or appropriate for the purpose of connecting superconducting memories at cryogenic temperature to transistor interfaces at room temperature when used in an electronic computer.

Figure 11:
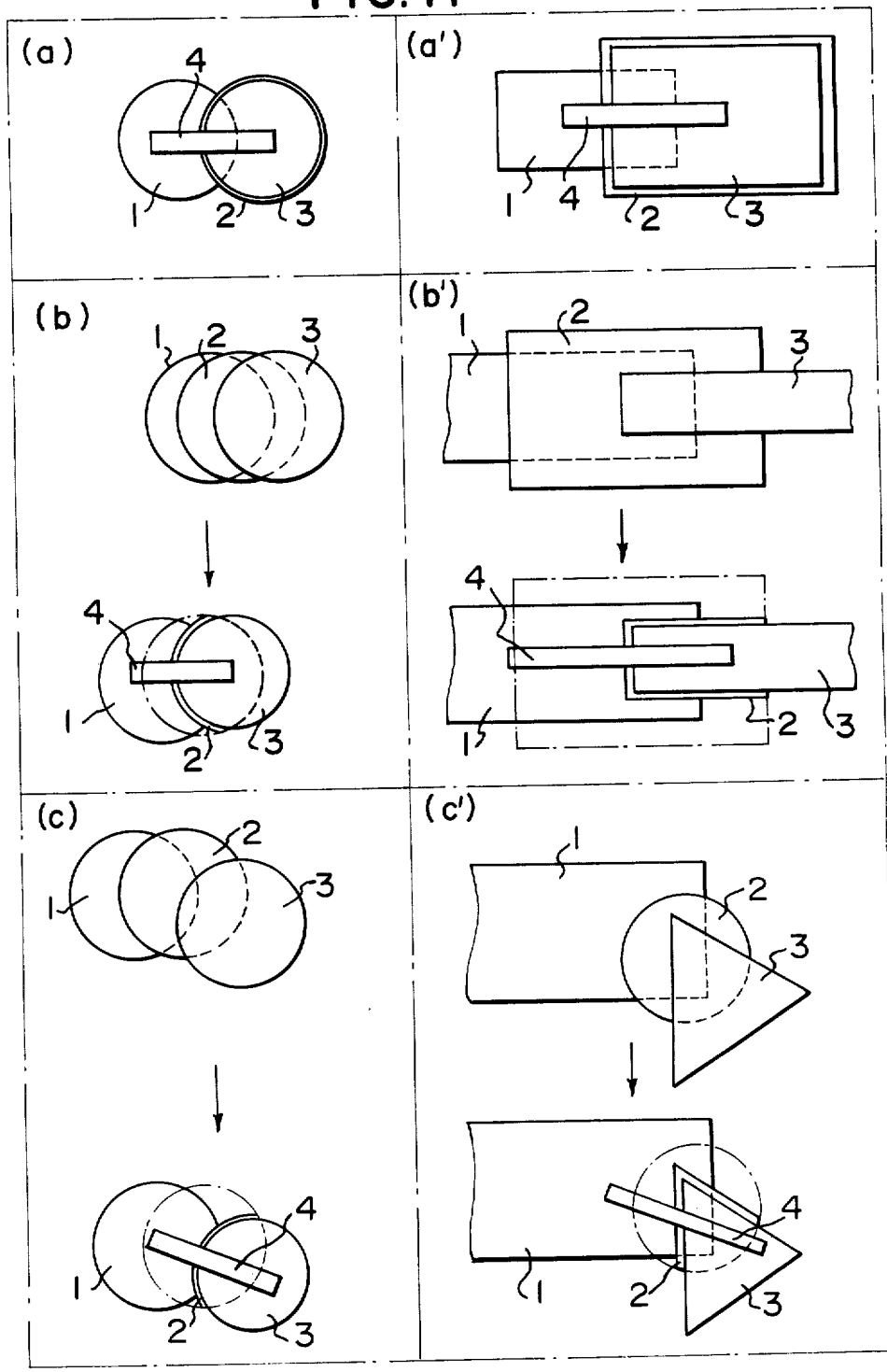
FIG. 11 shows some preferred embodiments according to this invention and manners in which they are produced.

Referring to FIG. 11 there are shown some embodiments of different shapes, and the manners in which these superconducting devices are made. The device of FIG. 11(a) is made with a circle-apertured resist mask whereas the device of FIG. 11(a') is made with a rectangle-apertured resist mask. These devices are produced in the same photolithography and etching process as described earlier with reference to FIG. 8.

In FIGS. 11(b), (b'), (c) and (c') semi-fabricated products are shown in the upper part, and the finished products are shown in the lower part.

The same photolithography and etching process as mentioned earlier with reference to FIG. 8 is applied to fabrication of these products, although atomically cleaning is continued for as long time as the part of the intermediate layer 2 indicated by dot-and-dash lines has been completely removed. The atomically cleaning is followed by coating the whole surface of the so-trimmed lamina deposition with a barrier material. Then, a strip of resist is put on a part of coated surface on which a weak link is to be formed, whereafter barrier material is removed from the unmasked part, selectively leaving only the barrier material under the resist mask, which is finally removed.

Figure 7:
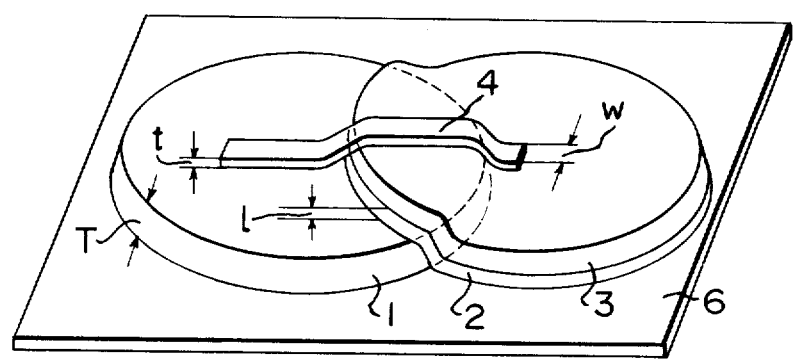
FIG. 7 shows a perspective view of a first preferred embodiment according to this invention.

As shown in FIG. 11, the geometrical shape of the superconductor layers 1, 3 and the insulative layer 2 are generally similar, either circular or rectangular. However, the shapes can be varied, as shown, for example, in FIG. 11(c') wherein the overlying superconductor is triangular in shape. In either case, the underlying insulative layer is etched so that a portion of the insulative layer 2 extends slightly beyond the edges of the superconductor layer 3 as shown in the drawings. It should also be apparent from FIG. 11 that it is possible to achieve constructions with even greater reductions in overlapping areas than that of FIG. 7 or FIG. 11(a). For example, in FIG. 7, and FIG. 11(a), the centers of circular insulative layer 2 and overlapping superconductor layer are offset with respect to the center of superconductor layer 1. Using circle-apertured resist masks, it is possible to offset the layers as shown in FIG. 11(b) or 11(c), to minimize the areas of the overlapping portions. FIG. 11(c') illustrates that different shaped resist masks may be utilized to form different layers. In this case, a rectangular mask was used for the superconductor layer 1, a circular mask for the insulative layer 2 and a triangular mask for the superconductor layer 3. Only a small portion of the triangular layer is disposed to overly a corner portion of the rectangular layer with the insulative layer being etched to leave a small insulating spacing layer extending slightly beyond the perimeter edge of the portion of the superconducting layer 3 superposed on the insulative layer 2 and superconductor layer 1.

Figure 12:
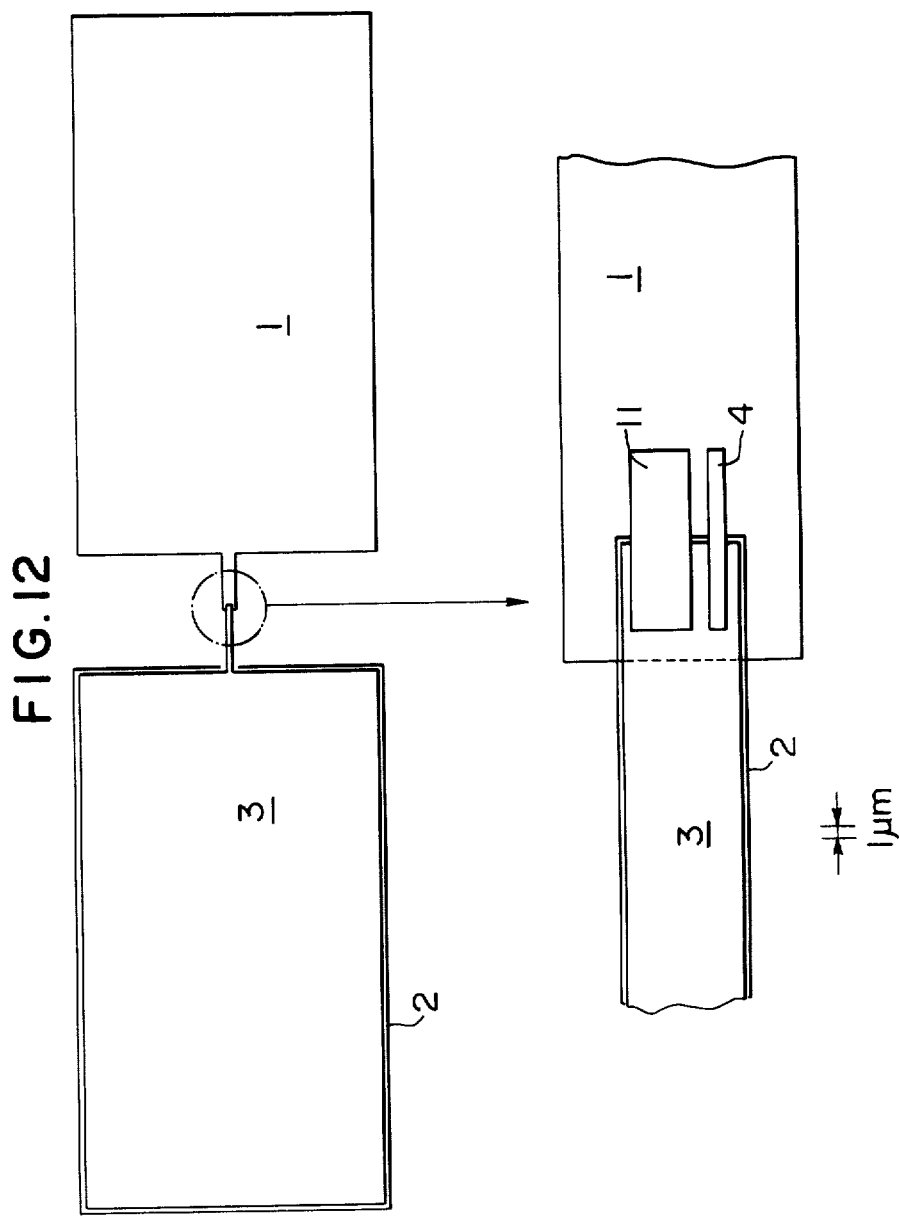
FIG. 12 shows another preferred embodiment according to this invention.

With reference to FIG. 12 an actual method of making "quasi-planar" Josephson junctions is described below in some details:

A 200 nm thick niobium film (2.5 mm × 4.5 mm) 1 was formed on a substrate by the photolithography.

An underlying 75 nm thick quartz film 2 and an overlying 200 nm thick niobium film 3 were formed on the substrate by the "lift-off" technique of photoresist:

A 1 μm thick protecting bridge 11 (below described) was formed by sputter-depositing silicon or germanium doped with impurities through a photoresist mask.

The whole surface of the multi-layer body was subjected to sputter-etching, thereby removing the superficial skin from the body, and presenting a clear-cut Nb-and-$SiO_2$ laminar edge slanting onto the underlying niobium layer 1. After the sputter-etching, niobium was sputter-deposited 30 nm thick on the whole area without breaking the vacuum in which the preceeding process has been carried out.

An elongated part 4 (15 μm long and 1.5 μm wide) was covered by a photoresist, and then the remaining part was subjected to sputter-etching or to chemical etching, thus removing the niobium coating from the unmasked part.

One hundred devices were fabricated on the substrate (63.5 mm × 63.5 mm) and were separated one from another with a diamond cutter.

As for the protecting bridge 11 a semiconductor material which is doped with impurities has a relatively low resistivity at room temperature and a relatively high resistivity at the liquid helium temperature. Therefore, the protecting bridge will provide a low-resistant bypass parallel to the weak link, thus causing undesired surge current to bypass the weak link, and preventing the breaking of the weak link due to the flow of surge current through the weak link. A Josephson junction equipped with no protecting bridge would be broken if a person whose body has stored spontaneously electric charge should touch the device with his fingers.

If an separator layer is made of a semiconductor which is doped with impurities, it will function in the same manner as the protecting bridge, thus obviating the necessity for such a protecting bridge.

Figure 13:
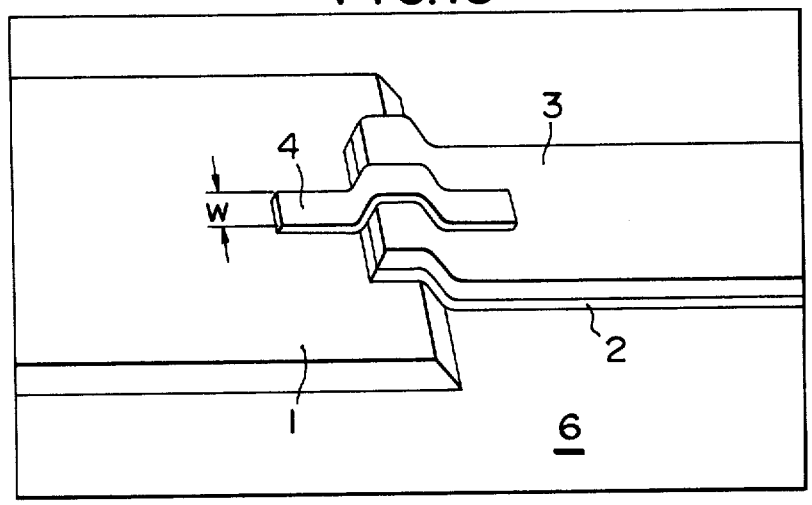
FIG. 13 shows a perspective view of an actual superconducting device according to this invention.

In a similar way "quasi-planar" Nb-Bi-Nb Josephson junctions were made. The particulars of the device exaggeratedly shown in FIG. 13 were as follows:
 substrate 6: fused quartz
 superconductor layer 1,3: niobium; 200 nm thick
 insulator layer 2: silicon dioxide; 75 nm thick
 weak link 4: bismuth; 3 $\mu$m thick and 35 $\mu$m wide overlapping area in which the superconductor layers 1 and 3 were laid on each other: about 70 $\mu m^2$.

Figure 14:
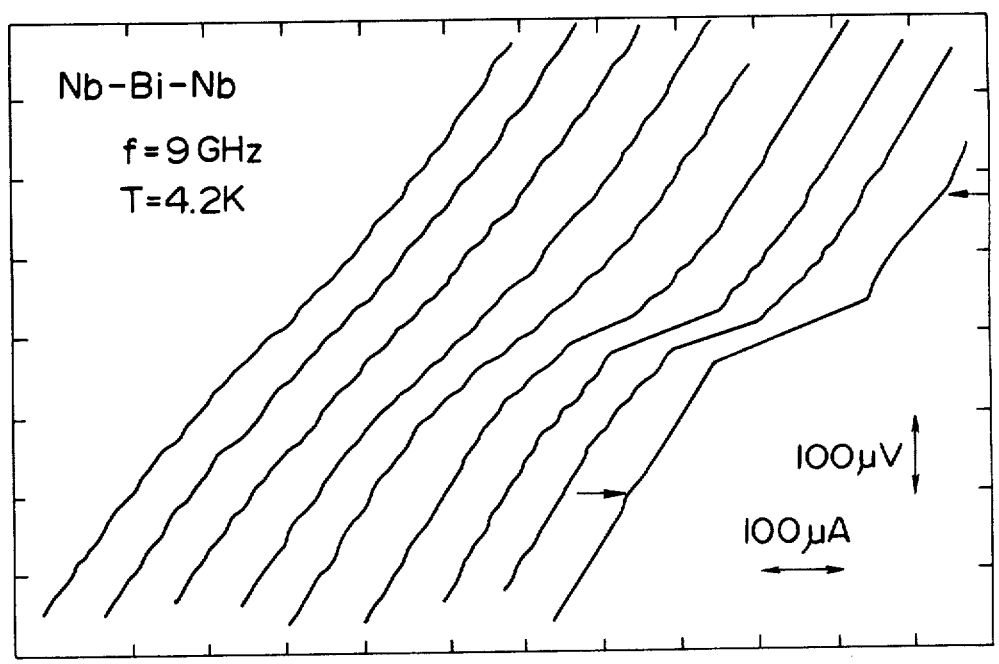
FIG. 14 is a graphic representation showing the "V-I" characteristics of the actual superconducting device of FIG. 13.

While maintaining at the liquid helium temperature (4.2 K.) the device was tested to find:
 junction resistance: 1.2
 junction capacitance: 0.04 PF
 critical current: 0.1 mA Referring to the graph given in FIG. 14, the right extreme voltage-current "V-I" curve was plotted without any applied microwave radiation, and the other "V-I" curves were plotted for incremental electromagnetic power (increasing left).

As seen from the graph, the "energy gap structures" appear around ±0.15 millivolts as indicated by arrow. This figure of voltage is almost equal to the product of the critical current and the junction resistance (0.12 milivolts), and this numerical agreement shows that the "structures" around ±0.15 milivolts really correspond to the energy gap of niobium. These "energy-gap structures" are remarkably noticeable, compared with those which could be seen inthe characteristic graph of the microbridge.

In spite of the relatively broad width of the weak link (35 $\mu$m wide) the junction resistance is as high as 1.2 ohms. The junction resistance can be easily increased by decreasing the width of the weak link to the extent that the device has a characteristic impedance high enough to enable an effective transfer of energy from the electromagnetic field to the device when used as a microwave radiation detector.

As is readily understood by artisans, the appearance of the "V-I" curves indicates the superiority of "quasi-planar" Josephson junctions to any conventional superconducting devices. Also, the "quasi-planar" configuration makes it possible to build a triple layer body of a superconducting material which is hard but is hardly diffusible to adjacent spacer material, as for instance in the form of Nb-Bi-Nb. The Nb-Bi-Nb junction showed no degradation due to interdiffusion of metals between adjacent layers after being left at room temperature for over two months.

What is claimed is:

1. A superconducting device comprising a laminar body including first and second superconductor layers, an insulative spacer layer therebetween and a conductive junction extending between said first and second superconductor layers and across the thickness of the insulative spacer layer and said first and second superconductor layers being offset and superposed with respect to each other such that only a portion of each of said superconductor layers overly each other.

2. A superconducting device according to claim 1 further comprising a conductive protecting bridge extending parallel and shunting said conductive junction.

3. A superconducting device according to claim 1 wherein said insulative spacer layer is a semiconductor material doped with impurities providing a resistivity layer having a low resistivity at room temperature and a high resistivity layer at the temperature of liquid helium.

4. A superconducting device according to claims 1, 2 or 3, wherein said conductive junction is of a material selected from the group consisting of a superconductor, a normal metal, a semimetal, and a semiconductor.

5. A superconducting device according to claim 4 wherein said first and second superconductor layers are of a superconductor material selected from the group consisting of Nb, Ta, La, Pb, Sn, In, al, alloy superconductors and compound superconductors.

6. A superconducting device comprising a laminar body including first and second superimposed superconductor layers, an insulative spacer layer therebetween and a conductive junction extending between said first and second superconductor layers and across the thickness of the insulative spacer layer.

7. A superconducting device according to claim 6 further comprising a conductive protecting bridge extending parallel and shunting said conductive junction.

8. A superconducting device according to claim 6 or 7 wherein said conductive junction is of a material selected from the group consisting of a superconductor, a normal metal, a semimetal, and a semiconductor.

9. A superconducting device according to claim 8 wherein said first and second superconductor layers are of a superconductor material selected from the group consisting of Nb, Ta, La, Pb, Sn, In, Al, alloy superconductors and compound superconductors.

10. A superconducting device comprising a laminar body including at least first, second and third superconductor layers an insulative spacer layer disposed between said third layer and said first and second layers, a first conductive junction extending between said third layer and said first layer, a second conductive junction extending between said third layer and said second layer, said first and said second conductive junctions extending across the thickness of said insulative spacer layer, said third layer being disposed on said insulative spacer layer, said insulative spacer layer being offset and superposed with respect to said first and said second layers such that only a portion of said third superconductor layer overlies a portion of each of the first and second layers.

11. A superconducting device as set forth in claim 10 wherein the conductive junctions form a series connection.

12. A superconducting device according to claim 10 wherein said conductive junctions are of a material selected from the group consisting of a superconductor, a normal metal, a semimetal, and a semiconductor.

13. A superconducting device according to claim 10 wherein said first, second and third superconductor layers are of a superconductor material selected from the group consisting of Nb, Ta, La, Pb, Sn, In, Al, alloy superconductors and compound superconductors.

14. A superconducting device comprising a laminar body including at least one set of semiconductor layers, each said set including a pair of first superconductor layers and a second superconductor layer, at least one insulative spacer layer disposed between the first pair of layers and said second layer, and conductive junctions extending between said second layer and each layer of said pair of superconductor layers and across the thickness of the insulative spacer layer and said second superconductor layer being offset and superposed with respect to each layer of said pair of superconductor layers such that only a portion of said second superconductor layer overlies a portion of each layer of said pair of superconductor layers.

15. A superconducting device as set forth in claim 14 further including a plurality of said sets of semiconductor layers, each set being spaced from the other along a longitudinal axis and the conductive junctions of each set being connected to form a series of Josephson junctions.

16. A superconducting device as set forth in claim 15 further including a second insulative layer and a further second superconductor layer on said second insulative layer, said second insulative layer being disposed between one of said pair of first superconductor layers of adjacent longitudinally spaced sets and overlying a portion of each said one of said pair of first superconductor layers, and, further a conductive junction extending between said further layer on said second insulative layer and each said one of said pair of first superconductor layers, said further conductive junction forming a series connection with said conductive junctions of said longitudinally spaced sets.

17. A superconducting device according to claim 10 or 14 further comprising a conductive protecting bridge extending parallel and shunting each said conductive junctions.

18. A superconducting device according to claim 14 wherein said conductive junctions are of a material selected from the group consisting of a superconductor, a normal metal, a semimetal, and a semiconductor.

19. A superconducting device according to claim 18 wherein said superconductor layers are of a superconductor material selected from the group consisting of Nb, Ta, La, Pb, Sn, In, Al, alloy superconductors and compound superconductors.

20. A superconducting device as set forth in claims 1, 6, 10 or 14 wherein the thickness of the insulative spacer layer is less that 100 Å, thereby forming a Josephson junction having a barrier length less than 100 Å.

21. A superconducting device according to claims 1, 6, 10 or 14 wherein the superconductor layers and insulative layer are of geometrical shape and the center of said insulative layer and a superconductor layer disposed to overlie said insulative layer are offset with respect to the center of a superconductor layer disposed to underlie said insulative layer.

22. A superconducting device according to claim 21 wherein said geometrical shapes are circular.

23. A superconducting device according to claim 21 wherein said geometric shapes are rectangular.

24. A superconducting device according to claim 21 wherein said insulative layer is disposed under the portion of the overlying superconductor layer and only slightly beyond the edges of that portion of the superconductor layer superposed over another superconductor layer.

25. A superconductor device according to claim 24 wherein said geometrical shapes of superposed superconducting layers are different.

26. A superconductor device according to claim 25 wherein one of the superconductor layers is rectangular in shape and the other superconductor layer is triangularly shaped.

* * * * *